(12) United States Patent
Yang

(10) Patent No.: US 8,437,193 B1
(45) Date of Patent: May 7, 2013

(54) FLASH MEMORY DATA RECOVERY

(75) Inventor: Xueshi Yang, Cupertino, CA (US)

(73) Assignee: Marvell International Ltd. (BM)

( * ) Notice: Subject to any disclaimer, the term of this patent is extended or adjusted under 35 U.S.C. 154(b) by 252 days.

(21) Appl. No.: 12/820,266

(22) Filed: Jun. 22, 2010

Related U.S. Application Data

(60) Provisional application No. 61/225,743, filed on Jul. 15, 2009.

(51) Int. Cl.
*G11C 11/34* (2006.01)
*G11C 16/04* (2006.01)

(52) U.S. Cl.
USPC .................. 365/185.18; 365/185.24

(58) Field of Classification Search ............. 365/185.24, 365/185.03, 185.18
See application file for complete search history.

(56) References Cited

U.S. PATENT DOCUMENTS

| | | | |
|---|---|---|---|
| 2008/0094914 A1* | 4/2008 | Park et al. | 365/185.24 |
| 2009/0003058 A1* | 1/2009 | Kang | 365/185.03 |
| 2010/0002522 A1* | 1/2010 | Park | 365/185.22 |

* cited by examiner

*Primary Examiner* — Hoai V Ho
*Assistant Examiner* — Tri Hoang

(57) ABSTRACT

An apparatus and method for selectively controlling application of a data recovery bias voltage are described. One example apparatus includes replenish logic configured to selectively control application of a data recovery bias voltage to a control gate associated with a cell in a flash memory apparatus. The replenish logic may be configured to select the data recovery bias voltage to replenish charge lost from a floating gate in the flash memory apparatus. The replenish logic may also be configured to control application of the data recovery bias voltage for a period of time sufficient to charge a threshold voltage (Vt) in the cell. In one embodiment, the data recovery bias voltage is based on a program voltage employed to program a value into the cell.

20 Claims, 9 Drawing Sheets

FLASH MEMORY DATA RECOVERY

CROSS REFERENCE TO RELATED APPLICATIONS

This application claims the benefit of U.S. provisional application Ser. No. 61/225,743 filed Jul. 15, 2009, which is hereby wholly incorporated by reference.

BACKGROUND

Flash memory devices may experience data retention issues. For example, data retention in a cell in a floating gate NAND memory may be compromised by charge loss at a floating gate in the cell. Charge may be lost through tunnels leading from the floating gate to a substrate. A flash cell's ability to hold onto its charge, and thus to accurately hold onto its programmed data value (e.g., 0, 1) varies inversely with the number of erase and program cycles experienced by the cell. In some examples, as few as seven erase and program cycles can degrade a flash cell where charge loss becomes significant enough to affect data retention capability.

Flash memory devices have programmed threshold voltage (Vt) distributions. When charge is lost in a cell, Vt distributions may deviate from the programmed value. If the Vt distribution deviation is sufficiently large, then data errors may appear in subsequent reads from the cell. Conventionally, some flash memory devices have accounted for charge loss related data retention issues by adjusting the read reference voltage for a cell. For example, the read reference voltage may be adjusted to track Vt distribution charge, as illustrated in prior art FIGS. 1, 2, and 3 to be described below.

Prior art FIG. 1 illustrates Vt distributions in a cell immediately after the cell is programmed. A first possible distribution 100 and a second possible distribution 110 are separated by a detection threshold 120. Distribution 100 and distribution 110 may represent the two possible values (e.g., 0, 1) that may be stored in a flash cell. Only one of the distributions would describe charge in a cell at a time. Since there is adequate separation between distribution 100 and distribution 110, and since neither distribution approaches the detection threshold 120, a correct value (e.g., 0, 1) would likely be readable from the cell.

Prior art FIG. 2 illustrates Vt distributions in a cell after a period of time and after a number of erase and program cycles. While first distribution 100 is substantially intact, second distribution 110 has degraded to distribution 130 due to charge lost from tunneling. Notice that distribution 130 is shifted and widened as compared to distribution 110. Distribution 130 has widened out so far that it has approached detection threshold 120. With this widening, it is possible that an incorrect value could be read from the cell. Thus, conventional systems may shift detection threshold 120. In some flash memories, a higher state distribution tends to shift more easily than a lower state distribution.

Prior art FIG. 3 illustrates the results of shifting detection threshold 120 to detection threshold 140 in response to the charge loss that produced shortened and widened distribution 130. While shifting detection threshold 120 to detection threshold 140 may temporarily alleviate some detection issues, this conventional approach may, over time, still yield some decoding failures. For example, decoding failures may occur when an excessive number of flash cells have experienced a charge loss beyond what can be accommodated by adjusting the detection threshold. One skilled in the art will appreciate that as distributions continue to widen and shift due to ongoing charge loss, that at some point there will be no location at which a detection threshold can be placed that will consistently produce accurate results. One skilled in the art will appreciate that information included in the background section is not admitted prior art.

SUMMARY

In one embodiment, an apparatus includes replenish logic configured to selectively control application of a data recovery bias voltage to a control gate associated with a cell in a flash memory apparatus. The replenish logic can select the data recovery bias voltage to replenish charge lost from a floating gate in the flash memory apparatus. The replenish logic can also control application of the data recovery bias voltage for a period of time sufficient to change a threshold voltage (Vt) in the cell. The data recovery bias voltage may be based, at least in part, on a program voltage employed to program a value into the cell.

In another embodiment, a method includes selectively recovering data in a cell in a flash memory by selectively altering a threshold voltage in the cell by applying a selected bias voltage for a selected period of time to a selected control gate associated with the cell.

In another embodiment, an apparatus includes a flash memory, voltage distribution alteration logic, and circuitry connecting the voltage distribution logic to the flash memory. The voltage distribution alteration logic is configured to selectively alter a threshold voltage in a cell in the flash memory by applying a bias voltage to a control gate associated with the cell. Applying the bias voltage replenishes charge lost from a floating gate associated with the control gate and the cell. The bias voltage is chosen to be less than a program voltage employed to program a value into the cell.

BRIEF DESCRIPTION OF THE DRAWINGS

The accompanying drawings, which are incorporated in and constitute a part of the specification, illustrate various examples of systems, methods, and other embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Prior art

Prior art

Prior art

DETAILED DESCRIPTION

The disclosure describes how to mitigate data retention issues associated with charge loss in flash memory. Examples of apparatuses and methods perform flash memory data recovery by replenishing lost charge using voltage biasing. In one example, a bias voltage is applied to a control gate of a targeted flash cell for a period of time to partially replenish lost charge.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware stored in a memory, software stored on a storage medium or in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

Figure 4:
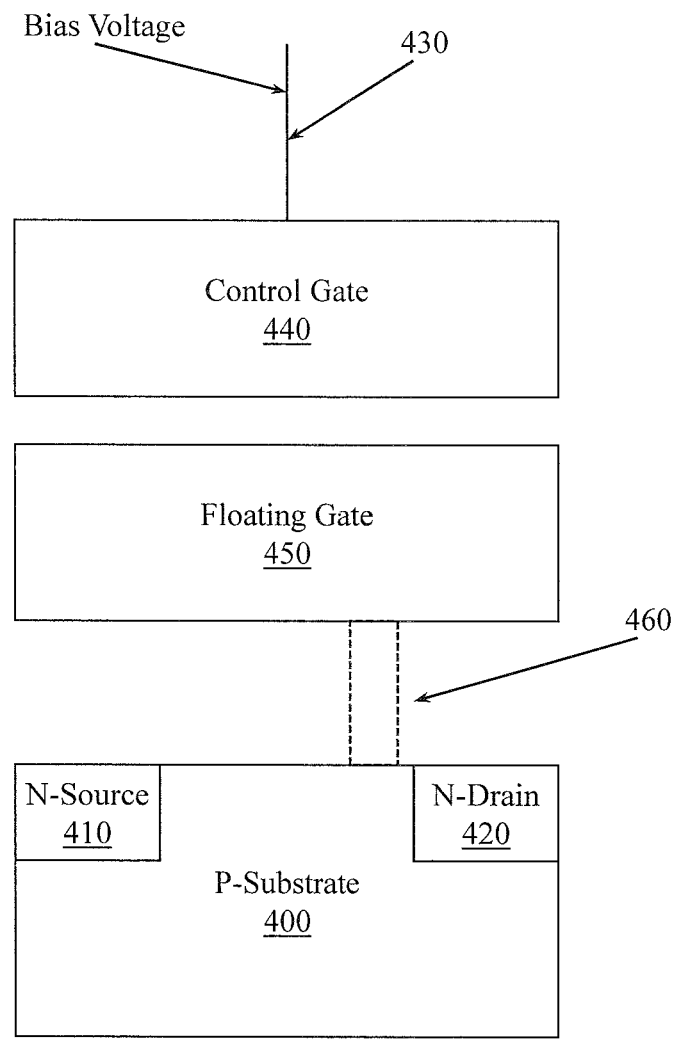
FIG. 4 illustrates portions of a flash cell.

FIG. 4 illustrates a flash memory cell in which a bias voltage can be applied to restore charge to mitigate data retention issues associated with charge loss. A P-substrate 400 has an N-source 410 and an N-drain 420. A wordline 430 is connected to a control gate 440. A bias voltage may be placed on wordline 430. The control gate 440 is separated from the P-substrate 400 by a floating gate 450. A generally undesired tunnel 460 may exist between the floating gate 450 and the P-substrate 400. Charge may be lost from the floating gate 450 to the P-substrate 400 through the tunnel 460. In this example, the control gate 440 may be driven to a desired voltage (e.g., 5V) to restore charge while the N-source 410 and the N-drain 420 are grounded to 0V. While 5V and 0V are described, one skilled in the art will appreciate that other voltages may be employed.

The bias voltage may be selected to facilitate replenishing a charge into a flash element (e.g., floating gate 450) without changing (e.g., flipping) the state of the cell if it has a correct value. In one embodiment the bias voltage is a positive voltage since electrons tend to get trapped at the floating gate 450. In one example, the bias voltage is less than the programming voltage for a flash cell. In one example the bias voltage may be similar to a conducting voltage (e.g., 5V) while in another example the bias voltage may be similar to a read voltage (e.g., 2V). In one example, the bias voltage is selected based on the programming voltage. For example, the bias voltage may be selected to be 50% of the programming voltage, 20% of the programming voltage, 10% of the programming voltage, or other voltages.

When the bias voltage is selected to be similar to a read voltage, then the bias voltage can be applied by issuing a read command(s) to a targeted cell(s). In one example, multiple read commands may be issued to apply the bias voltage over a desired period of time. In one example, the targeted cells may include a portion of a page or block or even a complete page or block.

NAND devices may be read using a two step sequence. First, a read command may be issued to the device. In response to this read command, a read voltage may be applied to the control gate of the flash cells at the targeted address. In response to the read voltage being applied, the device may fetch the data read to the page buffer in the device. When the data is ready in the page buffer, it may generate a signal that indicates that the data is ready to be transferred out of the device. The second step of actually transferring the data from the internal page buffer through the I/O bus to external controller. Examples of apparatuses and methods may use the first step, issuing a read command, to place a biasing voltage on the control gate. In some embodiments, apparatuses and methods may skip the second step and not transfer the data. Thus, in one example, a biasing voltage can be placed on the control gate using pre-existing circuitry and commands. In another example, an additional "place replenishing bias voltage" command may be added. In yet another example, additional circuitry may be added to a flash memory device to allow delivery of a bias voltage to a control gate. One skilled in the art will appreciate from the teachings herein that replenishing charge in a flash cell is the result of applying a bias voltage to a target cell, where the bias voltage is less than a voltage that changes the stored value in the target cell.

While one flash cell is described, in other embodiments more than one flash cell may be biased at a time. For example a page may be targeted. Multiple cells may be targeted because applying a voltage on one control gate may also apply a voltage on a neighbor control gate or on a group of neighboring control gates. Thus, in different examples, a target cell or page is targeted with direct biasing or indirect biasing. Direct biasing involves applying the bias voltage to the targeted cell or page. Indirect biasing involves applying the bias voltage to related (e.g., neighbor) cells or pages. Biasing a neighboring cell or page may replenish charge in a target cell or page by establishing a conducting voltage in the targeted cell or page. Read command(s) can be used in either direct biasing or indirect biasing.

Biasing a target flash cell facilitates replenishing charge lost after programming. Therefore, after biasing, charge loss related errors can be reduced. Reducing charge loss related errors can in turn reduce read errors. If biasing succeeds in replenishing lost charge, the Vt distributions can be tightened and shifted, at least partially, back towards the Vt distribution state established after programming.

Figure 1:
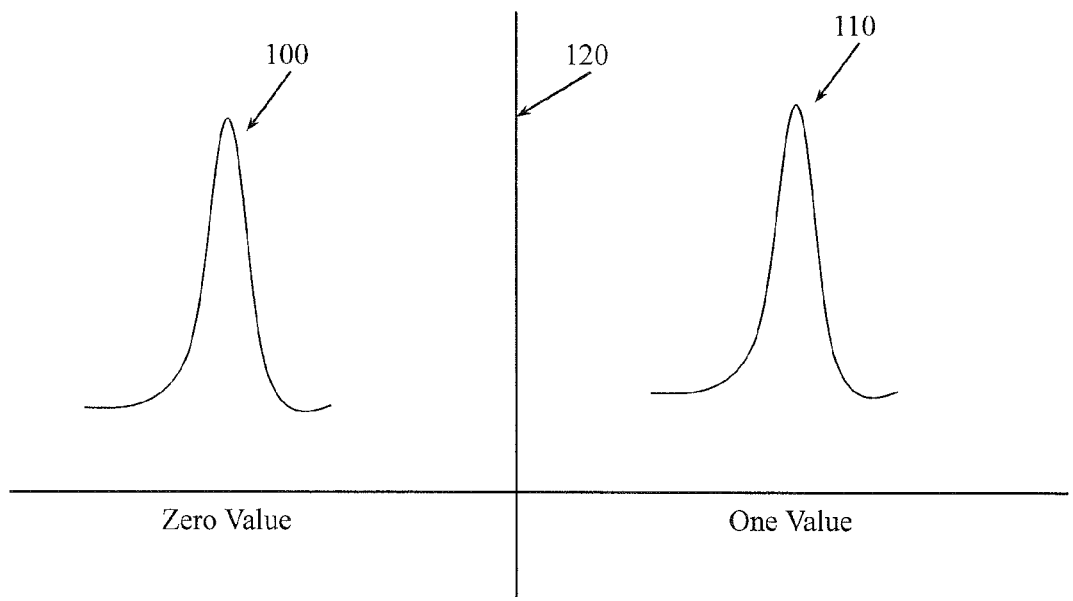
FIG. 1 illustrates Vt distribution in a flash cell before charge loss.
Figure 2:
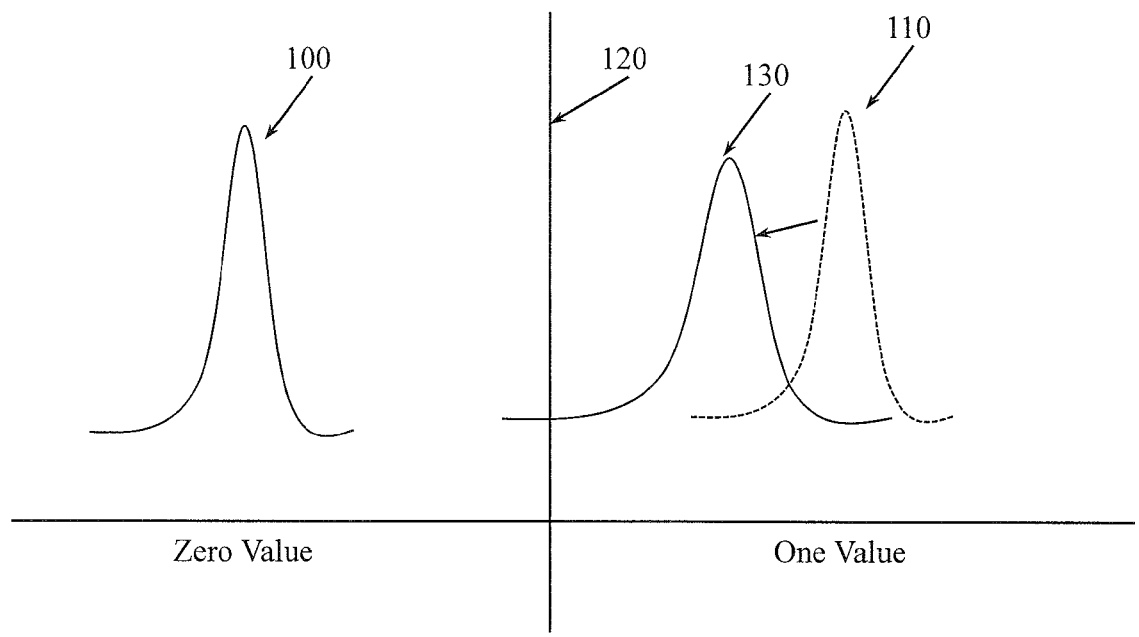
FIG. 2 illustrates Vt distribution in a flash cell after charge loss.
Figure 3:
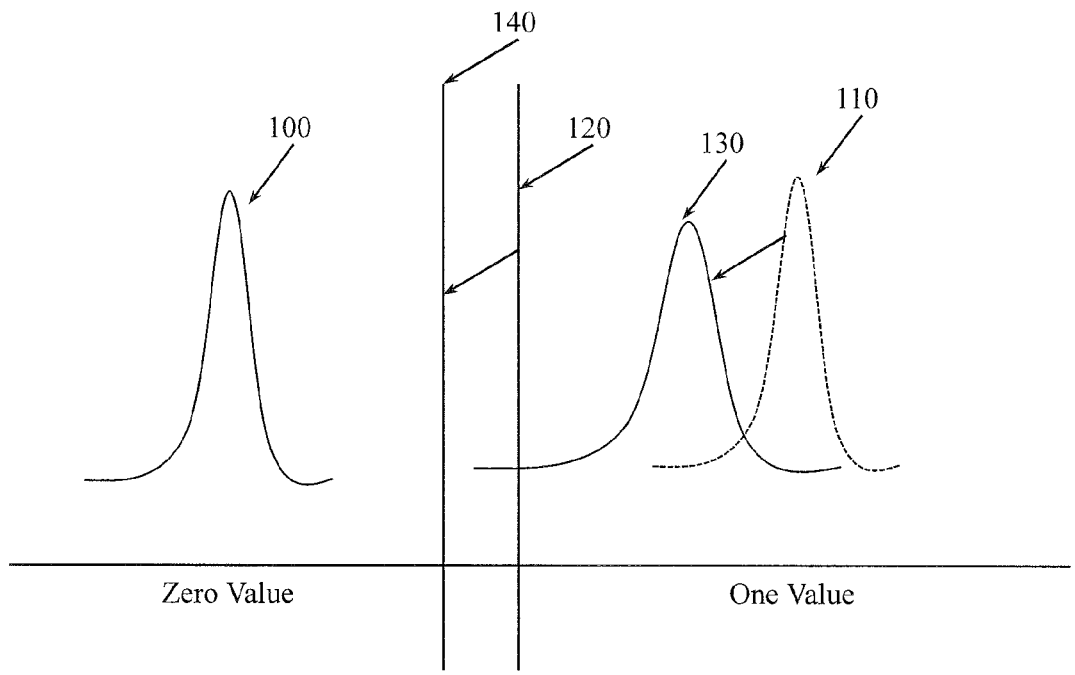
FIG. 3 illustrates detection threshold relocation in response to charge loss.
Figure 5:
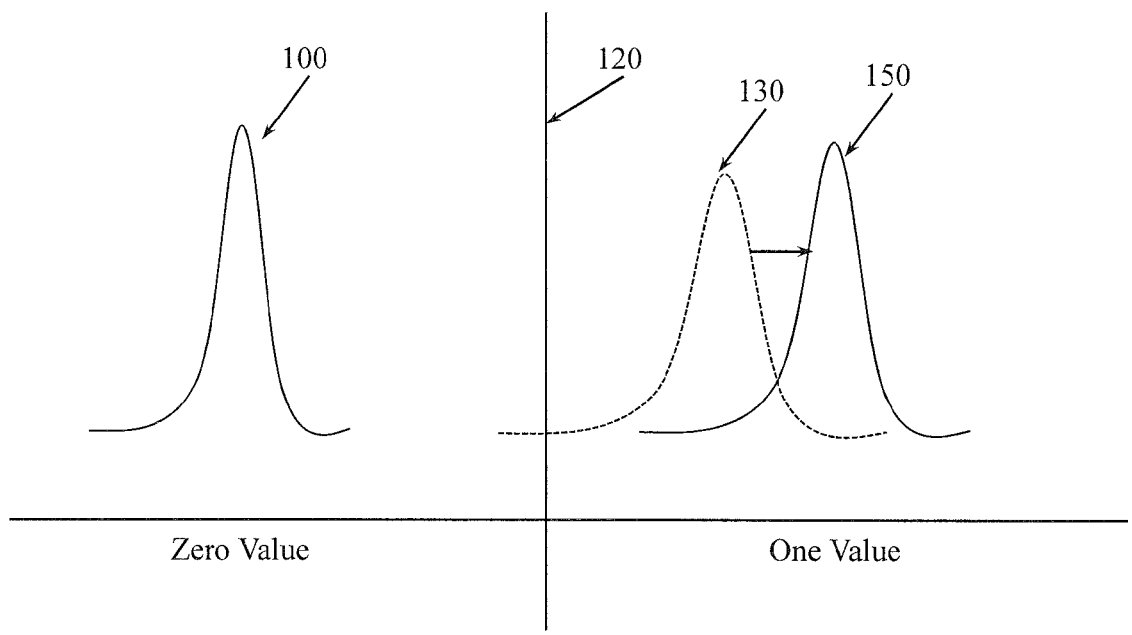
FIG. 5 illustrates Vt distribution after voltage biasing, and an adjusted detection threshold that reflects an altered read reference voltage.

FIG. 5 illustrates Vt distributions after voltage biasing. Distribution 130 has been shifted back and narrowed into distribution 150, which more closely resembles distribution 110 (Prior Art FIG. 1). Therefore the detection threshold 120 can be restored.

One skilled in the art will appreciate that different flash cells may experience different charge losses due to different tunneling effects. For example, flash cells that have more tunnels through which charge can move to the substrate oxide may suffer more charge loss. Similarly, and for similar reasons (e.g., number of tunnels) some flash cells may also experience different biasing effects. Thus, cells that experience the greatest charge loss through tunneling may also experience a complementary replenishing due to the number of tunnels.

Figure 6:
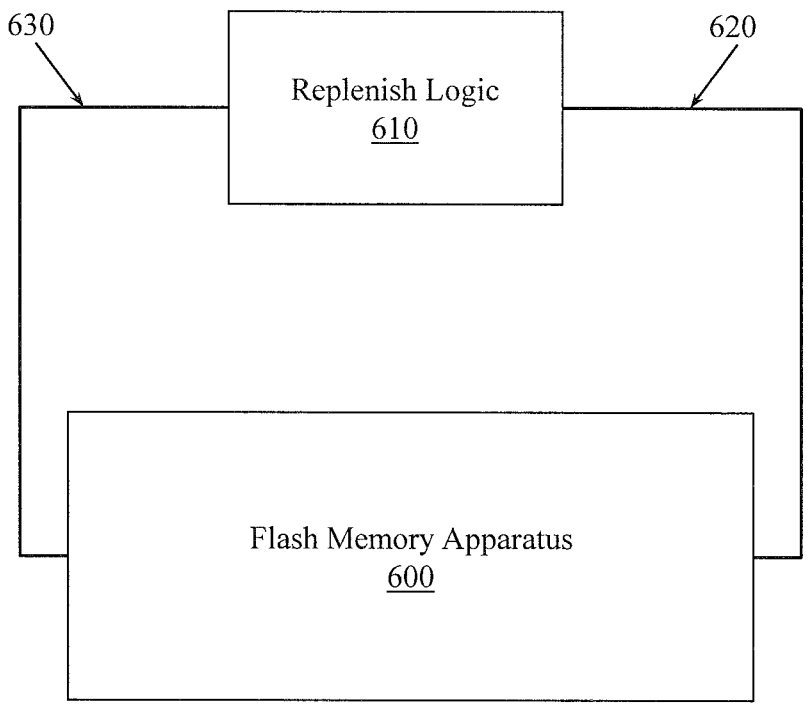
FIG. 6 illustrates an apparatus that recovers flash memory data by replenishing lost charge using voltage biasing.

FIG. 6 illustrates a flash memory apparatus 600 connected to a replenish logic 610. In one embodiment, the flash memory apparatus 600 is connected to the replenish logic 610 by conventional read circuitry 620. In another embodiment, flash memory apparatus 600 is connected to the replenish logic 610 by additional bias circuitry 630. In different embodiments, either read circuitry 620 or bias circuitry 630 operate as input lines or input circuitry to convey signals (e.g., commands) from replenish logic 610 to flash memory apparatus 600.

In one example, targeted cells may be replenished by providing a bias voltage on the bias circuitry 630. The bias voltage may be applied in response to a "replenish charge" command associated with the replenish logic 610 and/or in response to the replenish logic 610 issuing a number of read commands.

In one embodiment, replenish logic 610 selectively controls application of a data recovery bias voltage to a control gate associated with a cell in the flash memory apparatus 600. The replenish logic 610 may be configured to select the data recovery bias voltage to replenish charge lost from a floating gate in the flash memory apparatus 600. The replenish logic 610 is configured to control application of the data recovery bias voltage for a period of time sufficient to restore a desired threshold voltage (Vt) distribution in the cell. The data recovery bias voltage is selected to be less than a program voltage employed to program a value into the cell.

The replenish logic 610 may be configured to control application of the data recovery bias voltage using an input line connected to the flash memory apparatus 600. In one embodiment, the input line is part of read circuitry 620 associated with the flash memory apparatus 600. In this embodiment, the replenish logic 610 may be configured to control application of the data recovery bias voltage by issuing a number of read commands for the cell. A read command causes a read voltage to be applied to the control gate associated with the cell. In one embodiment, a read command includes a "prepare data" (a.k.a. array-to-buffer) portion and a "transfer data" portion. The portions may be separated by a period of time (usually referred to as_R) during which a data value in the flash cell is read to the internal buffer. In this embodiment, the replenish logic 610 controls application of the data recovery bias voltage by issuing the "prepare data" portion of a number of read commands while not issuing corresponding "transfer data" portions of the read commands. In different embodiments the replenish logic 610 may be configured to control application of the data recovery bias voltage by issuing read commands to the targeted cell and/or to cells other than the targeted cell.

In another embodiment, the input line is not a part of read circuitry 620 but is part of additional bias circuitry 630 associated with the flash memory apparatus 600. In this embodiment, the replenish logic 610 may be configured to control application of the data recovery bias voltage by issuing commands other than a read command. For example, replenish logic 610 can issue a "replenish charge" command, for example, via bias circuitry 630.

Examples of methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement a methodology. Blocks may be combined or separated into multiple components. Furthermore, additional and/or alternative methodologies can employ additional, not illustrated blocks.

Figure 7:
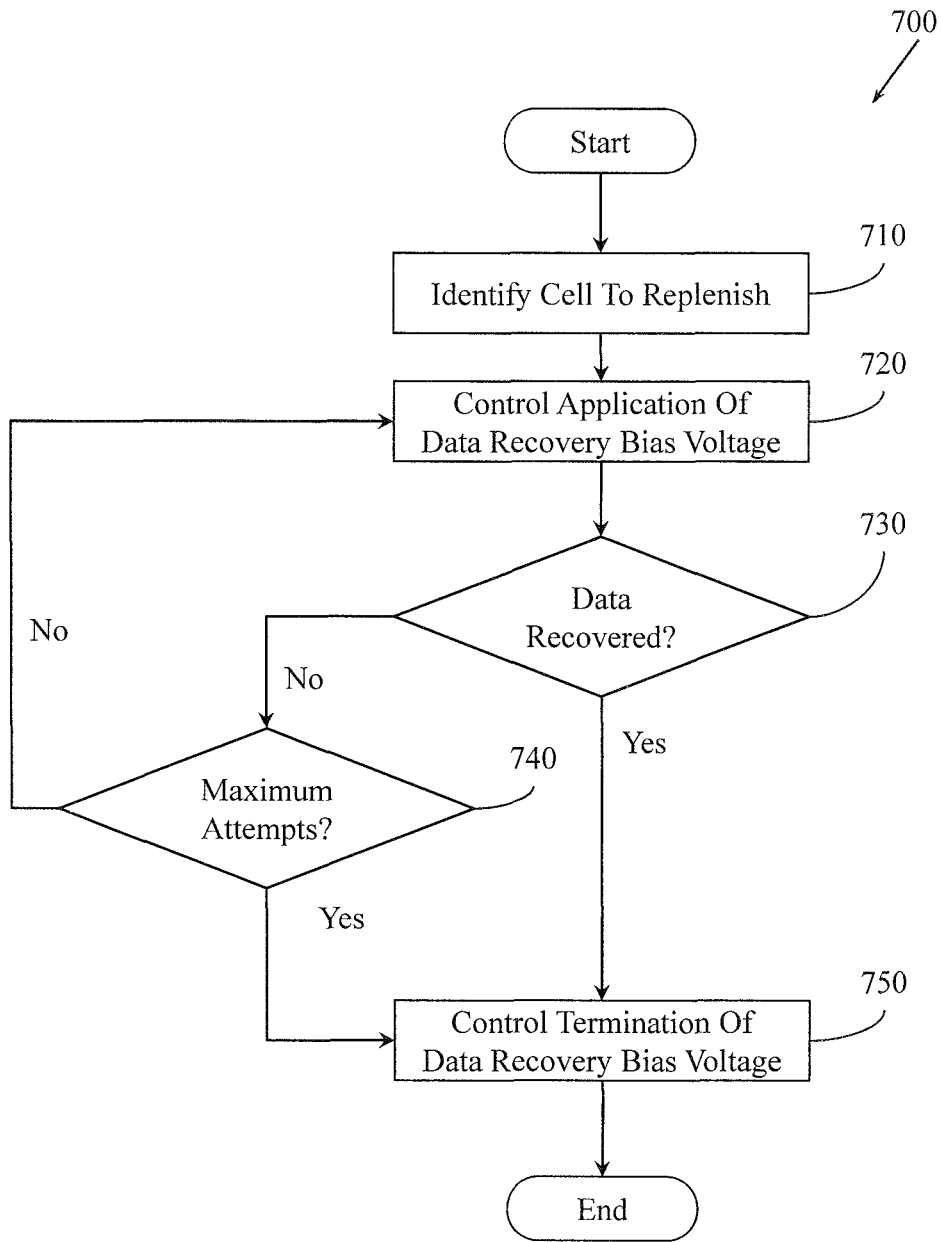
FIG. 7 illustrates a method for identifying cells to be replenished.

FIG. 7 illustrates a method 700. Method 700 identifies cells to be replenished and controls application and termination of a recovery bias voltage. At 710, a cell to be replenished is identified. Identifying cells to be replenished may include identifying a signal from a memory or from memory related logics, where the signal communicates that a correction apparatus cannot accommodate read errors from the memory. For example, an error correction code (ECC) logic may report that it cannot account for all the errors it encounters during a read. In one embodiment the cell for which data recovery is to be performed may be selected dynamically. The cell may be selected as a function of detecting that a number of bit errors associated with the cell meets or exceeds a threshold number of bit errors.

At 720, method 700 controls the application of the data recovery bias voltage. In one embodiment, different numbers of read commands may be issued to control applying the data recovery bias voltage for different periods of time. For example, issuing ten commands may cause the bias voltage to be applied for a first period of time, issuing one hundred commands may cause the bias voltage to be applied for a second longer period of time, and issuing a thousand commands may cause the bias voltage to be applied for a third even longer period of time. Different numbers of read commands can be selected as a function of the bias voltage to be applied. For example, a lesser number of read commands may be issued when a higher bias voltage is applied while a greater number of read commands may be issued when a lower bias voltage is applied. Different voltages may be employed. In one example, the data recovery bias voltage is a read voltage in the range of 0V to 8V while in another example the data recovery bias voltage is a control voltage in the range of 6V to 8V.

Method 700 then monitors data recovery and data recovery attempts. At 730, a determination is made concerning whether a desired amount of data recovery has occurred. If the determination is yes, then processing proceeds to 750, where method 700 controls the termination of the data recovery bias voltage. If the determination at 730 is no, then processing proceeds to 740, where another decision is made. Determining whether data has been recovered may include, for example, re-reading and re-decoding cells after providing the bias voltage. Determining whether data has been recovered may also include, for example, communicating with ECC logic after a read operation after a bias voltage based charge replenishment action. Stopping application of the data recovery bias voltage can occur in response to determining that a desired amount of data recovery has been achieved. In another example, application of the data recovery bias voltage is stopped in response to determining that a desired amount of data recovery has not been achieved and that a threshold number of read commands has been issued. If a desired amount of data recovery is achieved, then a detection threshold for the cell may be altered.

Therefore, at 740, a decision is made concerning whether a maximum number of attempts have been made to recover the data. The maximum number may be a count of the number of read commands applied, the number of partial read commands applied, and so on. If the determination at 740 is no, then processing returns to 720. Otherwise, if the determination at 750 is yes, then processing proceeds to 750 for termination of the data recovery bias voltage.

Figure 8:
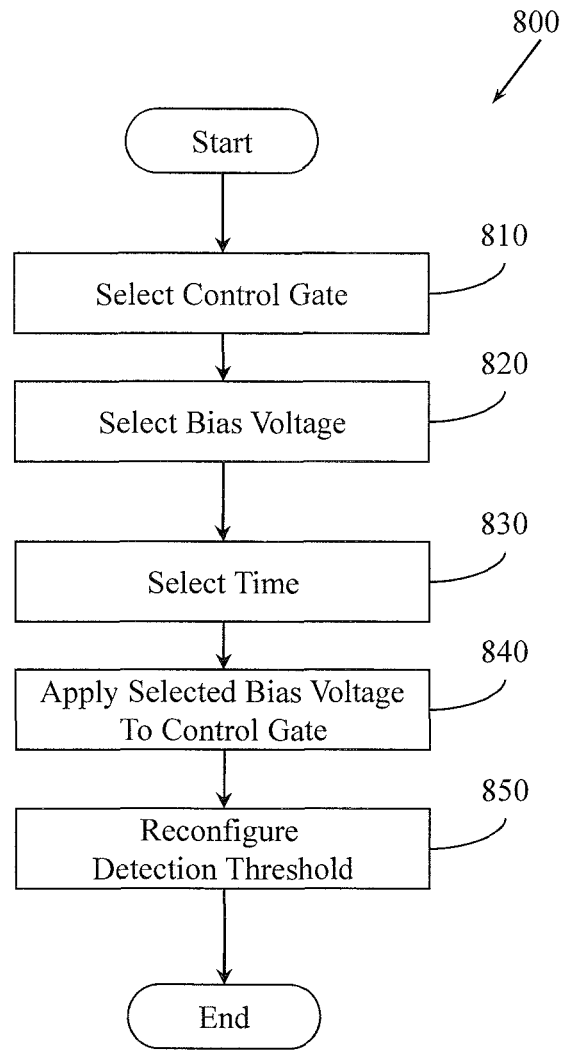
FIG. 8 illustrates a method for recovering flash memory data by replenishing lost charge using voltage biasing.

FIG. 8 illustrates a method 800. Method 800 selectively recovers data in a cell in a flash memory by selectively altering a threshold voltage in the cell by applying a selected bias voltage for a selected period of time to a selected control gate associated with the cell. To achieve this data recovery, method 800 performs several actions.

At 810, a control gate is selected. The control gate may be the gate for the cell to be recovered or the control gate may be a gate related to (e.g., neighboring) the cell to be recovered. At 820, a bias voltage is selected. In one example, the bias voltage is selected to be less than the program voltage. At 830, a period of time for which the bias voltage is to be applied is selected. The period of time may be selected as a function of a number of partial read commands issued to the flash memory. The partial read commands are configured to prepare a cell to be read by placing a read voltage on a control gate associated with the cell. However the partial read commands do not actually transfer the data. The bias voltage and time may be selected in combination based on the selected control gate.

At 840, a selected bias voltage is applied to the selected control gate(s) for the selected period of time to alter the voltage distribution in the cells. The bias voltage is selected to be less than a programming voltage that would change rather than recover the value in the cell.

At 850, in another embodiment, method 800 may reconfigure a detection threshold associated with the cell upon determining that data recovery has occurred. The manner in which the detection threshold is reconfigured may be based on determining the amount and/or character of data recovery performed in the cell.

Figure 9:
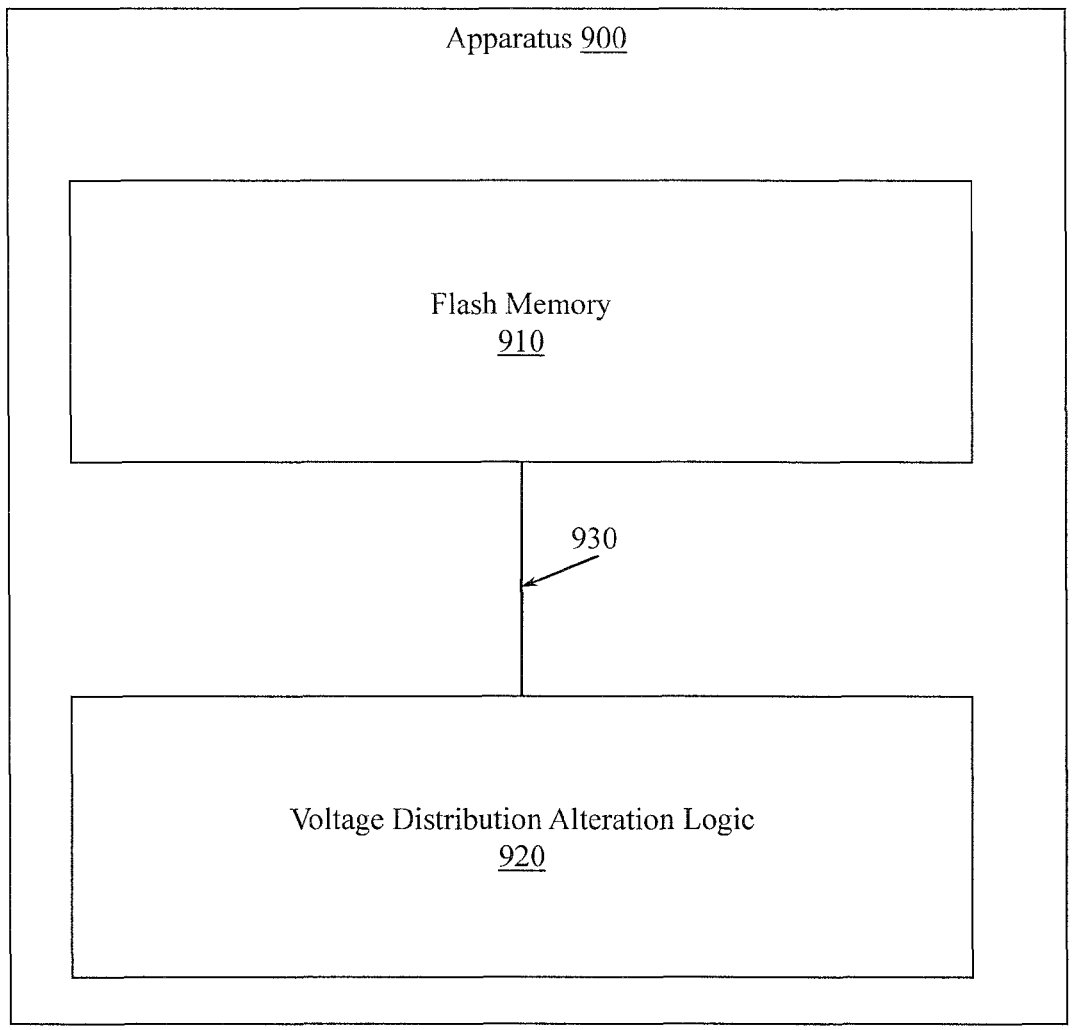
FIG. 9 illustrates an apparatus for recovering flash memory data.

FIG. 9 illustrates an apparatus 900. Apparatus 900 includes a flash memory 910, voltage distribution alteration logic 920, and circuitry 930 connecting the voltage distribution alteration logic 920 to the flash memory 910. In one example, the voltage distribution alteration logic 920 is configured to selectively alter voltage distribution in cells in the flash memory 910. The voltage distribution alteration logic 920 alters the voltage distribution by applying a bias voltage to control gates associated with the cells. Applying the bias voltage replenishes charge lost from a floating gate associated with the control gate and the cells.

To the extent that the term "includes" or "including" is employed in the detailed description or the claims, it is intended to be inclusive in a manner similar to the term "comprising" as that term is interpreted when employed as a transitional word in a claim.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

What is claimed is:

1. An apparatus, comprising:
    replenish logic configured to apply a data recovery bias voltage to a control gate for a cell in a flash memory apparatus,
    wherein the replenish logic is configured to select the data recovery bias voltage to replenish a charge lost from a floating gate in the cell,
    wherein the replenish logic is configured to apply the data recovery bias voltage by issuing a number of read commands to the cell, and wherein the number of read commands cause the data recovery bias voltage to be applied to the control gate that replenishes the charge of the floating gate in the cell, and
    wherein the replenish logic selects the number of read commands to issue to the cell as a function of the data recovery bias voltage.

2. The apparatus of claim 1, wherein the replenish logic is configured to dynamically select the cell as a function of detecting that a number of bit errors associated with the cell exceeds a threshold number of bit errors.

3. The apparatus of claim 1, wherein the replenish logic is configured to control application of the data recovery bias voltage using an input line connected to the flash memory apparatus, wherein the input line is part of read circuitry associated with the flash memory apparatus, and wherein the input line is configured to control application of a control voltage to the control gate associated with the cell in the flash memory apparatus.

4. The apparatus of claim 1, wherein the replenish logic is configured to apply the data recovery bias voltage for a period of time sufficient to change a threshold voltage (Vt) in the cell, and wherein the data recovery bias voltage is based on a program voltage used to program a value into the cell.

5. The apparatus of claim 1, wherein each of the number of read commands include a prepare data portion and a data transfer portion, and wherein the replenish logic is configured to control application of the data recovery bias voltage by issuing the prepare data portion of each of the number of read commands and by not issuing corresponding data transfer portions of the one or more read commands.

6. The apparatus of claim 1, wherein the replenish logic is configured to apply the data recovery bias voltage by issuing one or more read commands to one or more cells other than the cell in the flash memory apparatus.

7. The apparatus of claim 1, wherein the data recovery bias voltage is one of, a read voltage in the range of 0 V to 8V, and a conducting voltage in the range of 6V to 8V.

8. The apparatus of claim 1, wherein the number of read commands includes more than one hundred read commands.

9. The apparatus of claim 1, wherein the replenish logic is configured to selectively stop applying the data recovery bias voltage in response to determining that the charge in the cell has returned to within a threshold amount for data recovery.

10. The apparatus of claim 9, wherein the replenish logic is configured to alter a detection threshold for the cell in response to determining that the cell has returned to within the threshold amount for data recovery.

11. The apparatus of claim 1, wherein the replenish logic is configured to stop applying the data recovery bias voltage in response to determining that data recovery is not achieved and that the replenish logic has issued a threshold number of read commands.

12. The apparatus of claim 1, wherein the replenish logic is configured to apply the data recovery bias voltage using an input line connected to the flash memory apparatus, wherein the input line is not part of read circuitry associated with the flash memory apparatus, and wherein the input line is configured to apply a voltage to the control gate for the cell in the flash memory apparatus.

13. The apparatus of claim 1, wherein the replenish logic is configured to apply the data recovery bias voltage by issuing a command other than a read command.

14. A method, comprising:
recovering data of a cell in a flash memory by issuing a plurality of partial read commands to the flash memory to restore the data of the cell, wherein issuing the plurality of partial read commands applies a selected bias voltage to a control gate associated with the cell, wherein a number of read commands in the plurality of read commands are selected as a function of the selected bias voltage.

15. The method of claim 14, comprising:
selectively reconfiguring a detection threshold associated with the cell.

16. The method of claim 15, comprising selecting the selected bias voltage as a function of a program voltage associated with the cell, wherein the selected bias voltage is less than a program voltage used to program the data into the cell.

17. The method of claim 15, wherein applying the selected bias voltage includes applying the selected bias voltage for a period of time by controlling a number of the plurality of partial read commands issued to the flash memory, and wherein the plurality of partial read commands are configured to prepare the cell to be read by applying a read voltage on the control gate.

18. An apparatus, comprising:
a flash memory;
voltage distribution alteration logic; and
circuitry connecting the voltage distribution alteration logic to the flash memory,
wherein the voltage distribution alteration logic is configured to alter a threshold voltage in a cell in the flash memory by issuing a plurality of read commands to the cell to replenish a charge lost from a floating gate of the cell, wherein issuing the plurality of read commands applies a bias voltage to a control gate associated with the cell, and wherein a number of read commands in the plurality of read commands is selected as a function of the bias voltage.

19. The apparatus of claim 18, wherein the plurality of read commands are partial read commands that apply a read voltage to the control gate associated with the cell without reading a data value from the cell, and wherein the read voltage is equal to the bias voltage.

20. The apparatus of claim 18, wherein the bias voltage is less than a voltage sufficient to program a data value into the cell, and wherein the bias voltage is one of, a read voltage in the range of 0V to 8V, or a conducting voltage in the range of 6V to 8V.

* * * * *